United States Patent
Jiang et al.

(10) Patent No.: US 9,568,533 B2
(45) Date of Patent: Feb. 14, 2017

(54) METHOD AND APPARATUS FOR OPEN-WIRE FAULT DETECTION AND DIAGNOSIS IN A CONTROLLER AREA NETWORK

(71) Applicant: GM GLOBAL TECHNOLOGY OPERATIONS LLC, Detroit, MI (US)

(72) Inventors: Shengbing Jiang, Rochester Hills, MI (US); Xinyu Du, Oakland Township, MI (US); Natalie Ann Wienckowski, Sterling Heights, MI (US)

(73) Assignee: GM GLOBAL TECHNOLOGY OPERATIONS LLC, Detroit, MI (US)

( * ) Notice: Subject to any disclaimer, the term of this patent is extended or adjusted under 35 U.S.C. 154(b) by 73 days.

(21) Appl. No.: 14/720,382

(22) Filed: May 22, 2015

(65) Prior Publication Data

US 2015/0346259 A1    Dec. 3, 2015

Related U.S. Application Data

(60) Provisional application No. 62/003,337, filed on May 27, 2014.

(51) Int. Cl.

| G01R 31/00 | (2006.01) |
|---|---|
| G01R 31/02 | (2006.01) |
| G06F 11/30 | (2006.01) |
| G06F 11/34 | (2006.01) |
| H04L 12/40 | (2006.01) |
| H04L 12/26 | (2006.01) |

(52) U.S. Cl.
CPC ........... *G01R 31/025* (2013.01); *G01R 31/006* (2013.01); *G01R 31/026* (2013.01); *G06F 11/3013* (2013.01); *G06F 11/349* (2013.01); *H04L 12/40006* (2013.01); *H04L 43/0811* (2013.01); *H04L 2012/40215* (2013.01)

(58) Field of Classification Search
CPC ..... G01R 31/00; G01R 31/024; G01R 31/025; G01R 31/08; G01R 31/28; G01R 31/002; G01R 31/04; G01R 31/2808; G01R 31/2818; G01R 31/31901; G01R 31/26; G01R 31/2886; G01R 31/041; G01R 27/18; G01R 1/0408; G01R 1/06; G01R 1/067; G01R 1/0433; G01R 1/0483; G01R 1/07314; G01R 1/0416; G01R 1/07378
USPC ........................ 324/500, 509, 512, 537, 538, 555,324/756.01, 756.05; 439/34, 251, 921, 949; 702/1, 57, 58, 59; 361/42, 54
See application file for complete search history.

(56) References Cited

U.S. PATENT DOCUMENTS

| 3,333,186 A * | 7/1967 | Mowery | ............ | G01R 31/2813 |
| | | | | 324/538 |
| 5,765,031 A * | 6/1998 | Mimuth | ............ | H04L 12/40032 |
| | | | | 714/43 |

(Continued)

*Primary Examiner* — Jermele M Hollington
*Assistant Examiner* — Demetrius Pretlow

(57) ABSTRACT

A controller area network (CAN) includes a CAN bus with a CAN-H wire, a CAN-L wire, a pair of CAN bus terminators located at opposite ends of the CAN bus, each terminator having a corresponding known terminator resistance value, a plurality of nodes including controllers wherein at least one of said controllers is a monitoring controller. The monitoring controller includes a detection control routine for detecting the presence of a wire-open fault on the CAN bus, including determining a CAN bus resistance, and determining a wire-open fault on the CAN bus based upon the determined CAN bus resistance and the terminator resistance values.

15 Claims, 8 Drawing Sheets

(56) References Cited

U.S. PATENT DOCUMENTS

| | | | | |
|---|---|---|---|---|
| 8,015,445 B2* | 9/2011 | Ando | ................. | H04L 43/0823 |
| | | | | 714/25 |
| 2008/0186870 A1* | 8/2008 | Butts | ................. | H04L 41/0659 |
| | | | | 370/252 |
| 2012/0299602 A1* | 11/2012 | Chiu | ................. | G01R 31/026 |
| | | | | 324/548 |

* cited by examiner

METHOD AND APPARATUS FOR OPEN-WIRE FAULT DETECTION AND DIAGNOSIS IN A CONTROLLER AREA NETWORK

CROSS REFERENCE TO RELATED APPLICATIONS

This application claims the benefit of U.S. Provisional Application No. 62/003,337, filed on May 27, 2014, which is incorporated herein by reference.

TECHNICAL FIELD

This disclosure relates to fault isolation for communications in controller area networks.

BACKGROUND

The statements in this section merely provide background information related to the present disclosure. Accordingly, such statements are not intended to constitute an admission of prior art.

Vehicle systems include a plurality of subsystems, including by way of example, engine, transmission, ride/handling, braking, HVAC, and occupant protection. Multiple controllers may be employed to monitor and control operation of the subsystems. The controllers can be configured to communicate via a controller area network (CAN) to coordinate operation of the vehicle in response to operator commands, vehicle operating states, and external conditions. A fault can occur in one of the controllers that affects communications via a CAN bus.

Topology of a network such as a CAN refers to a connective arrangement among network elements, and preferably includes a plurality of nodes having interconnected or dispersed power, ground or communications links. A physical topology describes arrangement or layout of physical elements including links and nodes, wherein nodes include controllers and other connected devices and links include either power, ground or communications links in the form of suitable cables, wires, printed wiring boards (PWBs), printed circuit boards (PCBs), flexible strips, and the like. A logical topology describes flow of data messages, power or grounding within a network between nodes employing power, ground or communications links. Known CAN systems employ a bus topology for the communication connection among all the controllers that can include a linear topology, a star topology, or a combination of star and linear topologies. Known CAN systems employ separate power and ground topologies for the power and ground lines to all the controllers. Known controllers communicate with each other through messages that are sent at different periods on the CAN bus.

Known systems detect faults at a message-receiving controller, with fault detection accomplished for the message using signal supervision and signal time-out monitoring at an interaction layer of the controller. Faults can be reported as a loss of communications, e.g., a loss of a communicated data message. Such detection systems generally are unable to identify a root cause of a fault, and are unable to distinguish transient and intermittent faults.

SUMMARY

A controller area network (CAN) includes a CAN bus with a CAN-H wire, a CAN-L wire, a pair of CAN bus terminators located at opposite ends of the CAN bus, each terminator having a corresponding known terminator resistance value, a plurality of nodes including controllers wherein at least one of said controllers is a monitoring controller. The monitoring controller includes a detection control routine for detecting the presence of a wire-open fault on the CAN bus, including determining a CAN bus resistance, and determining a wire-open fault on the CAN bus based upon the determined CAN bus resistance and the terminator resistance values.

BRIEF DESCRIPTION OF THE DRAWINGS

One or more embodiments will now be described, by way of example, with reference to the accompanying drawings, in which.

DETAILED DESCRIPTION

Figure 1:
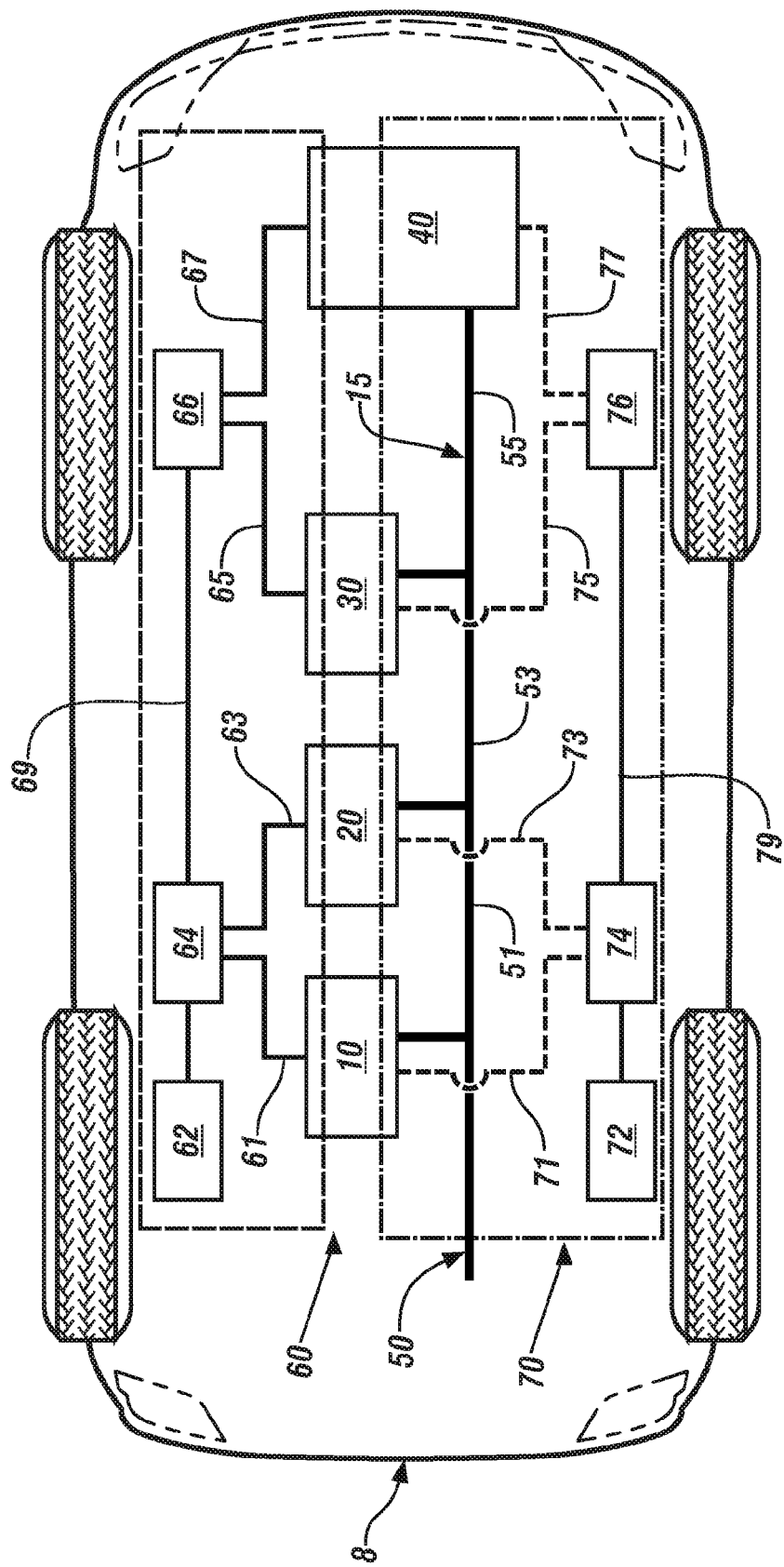
FIG. 1 illustrates a vehicle including a controller area network (CAN) with a CAN bus and a plurality of nodes, e.g., controllers, in accordance with the disclosure.

Referring now to the drawings, wherein the showings are for the purpose of illustrating certain exemplary embodiments only and not for the purpose of limiting the same, FIG. 1 illustrates a vehicle 8 including a controller area network (CAN) 50 including a CAN bus 15 and a plurality of nodes, i.e., controllers 10, 20, 30 and 40. The term "node" refers to any active electronic device that signally connects to the CAN bus 15 and is capable of sending, receiving, or forwarding information over the CAN bus 15. Each of the controllers 10, 20, 30 and 40 signally connects to the CAN bus 15 and electrically connects to a power grid 60 and a ground grid 70. Each of the controllers 10, 20, 30 and 40 includes an electronic controller or other on-vehicle device that is configured to monitor or control operation of a subsystem of the vehicle 8 and communicate via the CAN bus 15. In one embodiment, one of the controllers, e.g., controller 40, is configured to monitor the CAN 50 and the CAN bus 15, and may be referred to herein as a CAN controller. The illustrated embodiment of the CAN 50 is a non-limiting example of a CAN, which may be employed in any of a plurality of system configurations.

The CAN bus 15 includes a plurality of communications links, including a first communications link 51 between controllers 10 and 20, a second communications link 53 between controllers 20 and 30, and a third communications link 55 between controllers 30 and 40. The power grid 60 includes a power supply 62, e.g., a battery that electrically connects to a first power bus 64 and a second power bus 66 to provide electric power to the controllers 10, 20, 30 and 40 via power links. As shown, the power supply 62 connects to the first power bus 64 and the second power bus 66 via power links that are arranged in a series configuration, with power link 69 connecting the first and second power buses 64 and 66. The first power bus 64 connects to the controllers 10 and 20 via power links that are arranged in a star configuration, with power link 61 connecting the first power bus 64 and the controller 10 and power link 63 connecting the first power bus 64 to the controller 20. The second power bus 66 connects to the controllers 30 and 40 via power links that are arranged in a star configuration, with power link 65 connecting the second power bus 66 and the controller 30 and power link 67 connecting the second power bus 66 to the controller 40. The ground grid 70 includes a vehicle ground 72 that connects to a first ground bus 74 and a second ground bus 76 to provide electric ground to the controllers 10, 20, 30 and 40 via ground links. As shown, the vehicle ground 72 connects to the first ground bus 74 and the second ground bus 76 via ground links that are arranged in a series configuration, with ground link 79 connecting the first and second ground buses 74 and 76. The first ground bus 74 connects to the controllers 10 and 20 via ground links that are arranged in a star configuration, with ground link 71 connecting the first ground bus 74 and the controller 10 and ground link 73 connecting the first ground bus 74 to the controller 20. The second ground bus 76 connects to the controllers 30 and 40 via ground links that are arranged in a star configuration, with ground link 75 connecting the second ground bus 76 and the controller 30 and ground link 77 connecting the second ground bus 76 to the controller 40. Other topologies for distribution of communications, power, and ground for the controllers 10, 20, 30 and 40 and the CAN bus 15 can be employed with similar effect.

Control module, module, control, controller, control unit, processor and similar terms mean any one or various combinations of one or more of Application Specific Integrated Circuit(s) (ASIC), electronic circuit(s), central processing unit(s) (preferably microprocessor(s)) and associated memory and storage (read only, programmable read only, random access, hard drive, etc.) executing one or more software or firmware programs or routines, combinational logic circuit(s), input/output circuit(s) and devices, appropriate signal conditioning and buffer circuitry, and other components to provide the described functionality. Software, firmware, programs, instructions, routines, code, algorithms and similar terms mean any instruction sets including calibrations and look-up tables. The control module has a set of control routines executed to provide the desired functions. Routines are executed, such as by a central processing unit, and are operable to monitor inputs from sensing devices and other networked control modules, and execute control and diagnostic routines to control operation of actuators. Routines may be executed at regular intervals, for example each 100 microseconds, 3.125, 6.25, 12.5, 25 and 100 milliseconds during ongoing engine and vehicle operation. Alternatively, routines may be executed in response to occurrence of an event.

Each of the controllers 10, 20, 30 and 40 transmits and receives messages across the CAN 50 via the CAN bus 15, with message transmission rates occurring at different periods for different ones of the controllers. A CAN message has a known, predetermined format that includes, in one embodiment, a start of frame (SOF), an identifier (11-bit identifier), a single remote transmission request (RTR), a dominant single identifier extension (IDE), a reserve bit (r0), a 4-bit data length code (DLC), up to 64 bits of data (DATA), a 16-bit cyclic redundancy check (CRC), 2-bit acknowledgement (ACK), a 7-bit end-of-frame (EOF) and a 3-bit interframe space (IFS). A CAN message can be corrupted, with known errors including stuff errors, form errors, ACK errors, bit 1 errors, bit 0 errors, and CRC errors. The errors are used to generate an error warning status including one of an error-active status, an error-passive status, and a bus-off error status. The error-active status, error-passive status, and bus-off error status are assigned based upon increasing quantity of detected bus error frames, i.e., an increasing bus error count. Known CAN bus protocols include providing network-wide data consistency, which can lead to globalization of local errors. This permits a faulty, non-silent controller to corrupt a message on the CAN bus 15 that originated at another of the controllers. A faulty, non-silent controller is referred to herein as a fault-active controller. When one of the controllers is assigned the bus-off error status, it is prohibited from communicating on the CAN bus for a period of time. This includes prohibiting the affected controller from receiving messages and from transmitting messages until a reset event occurs, which can occur after an elapsed period of time when the controller is inactive. Thus, when a fault-active controller is assigned the bus-off error state, it is prohibited from communicating on the CAN bus for a period of time, and is unable to corrupt other messages on the CAN bus during the period of time when it is inactive.

Figure 2:
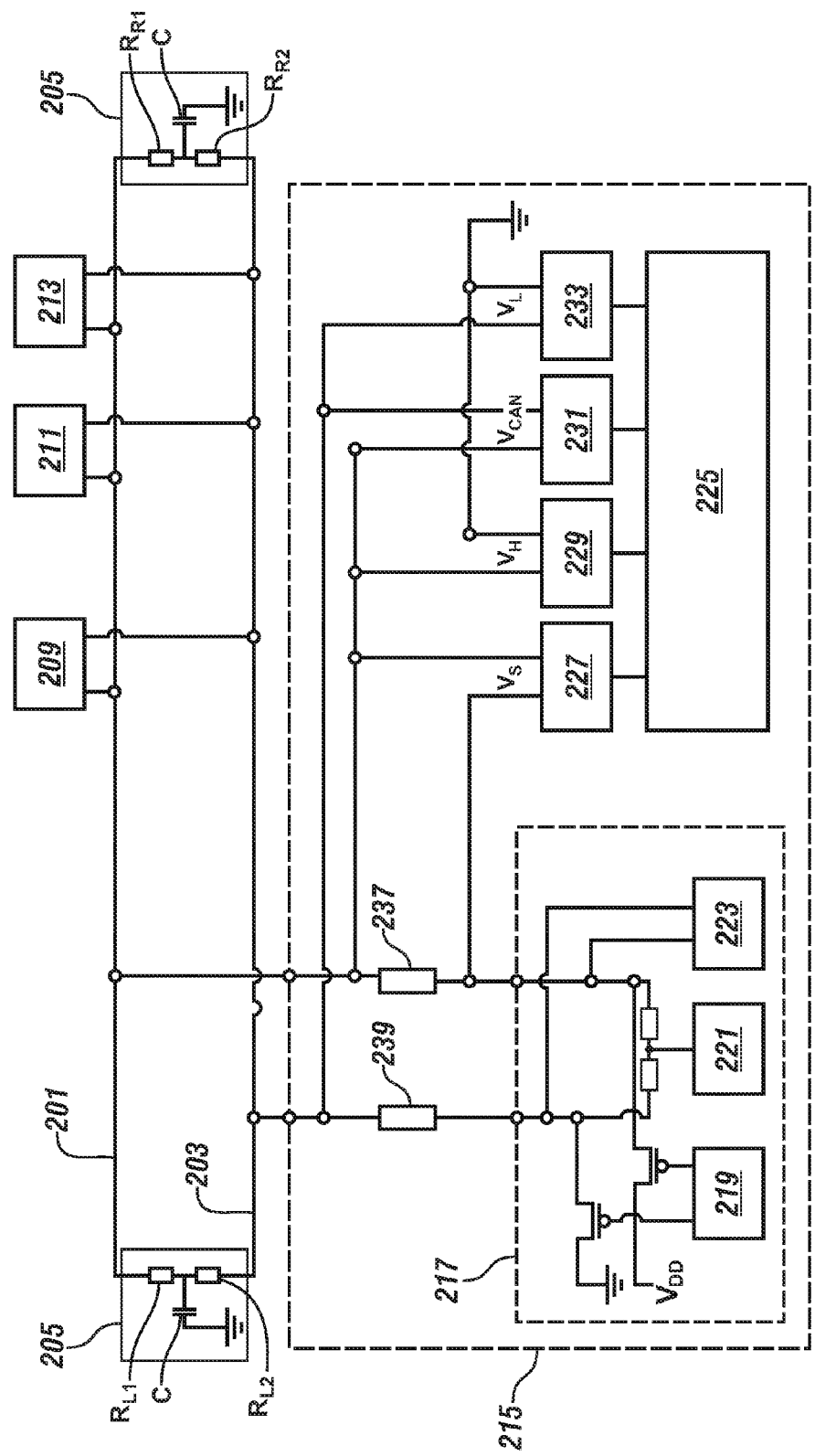
FIG. 2 illustrates an integrated controller area network similar to the CAN of FIG. 1, including a plurality of nodes, e.g., controllers, a monitoring controller, and a two-wire CAN bus including wire cables CAN-H and CAN-L electrically connected between terminators in a split termination configuration, in accordance with the disclosure.

FIG. 2 illustrates one embodiment of an integrated controller area network similar to the CAN shown with reference to FIG. 1, including a two-wire CAN bus including wire cables CAN-H 201 and CAN-L 203 electrically connected between terminators 205, 207 in a split termination configuration. Each of the terminators electrically connects to ground via a respective pair of resistors and a respective capacitive element. The resistors in each pair are in series and the pair is coupled at one end to the CAN-H wire and at the other end to the CAN-L wire. The terminator to the left in the figure is labeled with upper and lower resistors $R_{L1}$ and $R_{L2}$, whereas the terminator to the left in the figure is labeled with upper and lower resistors $R_{R1}$ and $R_{R2}$. Upper resistors $R_{L1}$ and $R_{R1}$ each couple to the CAN-H bus wire at opposite ends of the bus, whereas lower resistors $R_{L2}$ and $R_{R2}$ each couple to the CAN-H bus wire at opposite ends of the bus. The capacitors in each terminator are labeled C and are coupled between ground and the node between the respective pair of resistors. Thus in the split configuration termination each terminator has a total resistance equal to the series combination of the respective pairs of upper and lower resistors. And, the total CAN bus resistance (i.e. between CAN-H wire and CAN-L wire) is substantially equal to the termination resistances of the terminators in parallel. In one embodiment all of the terminator resistors are equivalent having a value of 60Ω, and the capacitive elements are equivalent having a value of 4.7 nF. Thus each terminator has a total resistance equal 120Ω. And, the total CAN bus resistance (i.e. between CAN-H wire and CAN-L wire) is substantially equal to 60Ω. Alternative configurations are envisioned wherein the total resistance of each terminator is equivalent to the other but the upper and lower resistors each have a different value. Alternative configurations are envisioned wherein the total resistance of each terminator is equivalent to the other, the upper resistors are equivalent to each other, the lower resistors are equivalent to each other, but the upper and lower resistors are not equivalent to each other. In any envisioned alternative, it may be desirable that the total CAN bus resistance (i.e. between CAN-H wire and CAN-L wire) is substantially equal to 60Ω or some other industry standard.

A plurality of nodes, e.g., controllers ECU1 209, ECU2 211, ECU3 213 and ECU-M 215 signally connect to the CAN. As shown, ECU-M 215 is a monitoring controller. Each of the controllers may be capable of monitoring and providing the same or similar diagnostic functionality as that described with respect to ECU-M 215. The split termination configuration improves electromagnetic compatibility by eliminating common-mode errors.

The monitoring controller ECU-M 215 includes a CAN transceiver device 217 including a signal transmitter 219, a bias control 221 and a receiver 223 that signally connect to the wire cables CAN-H 201 and CAN-L 203 of the CAN bus via first and second shunt resistors ($R_S1$ 237, $R_S2$ 239), respectively. The first and second shunt resistors are high-precision, low impedance devices each preferably having a value at or near 1.0Ω and preferably of the same resistance value. The monitoring controller ECU-M 215 also includes a microcontroller (MCU) 225 that signally connects to a plurality of analog-to-digital converters (ADC1 227, ADC2 229, ADC3 231, ADC4 233) and a plurality of executable control routines.

As shown in one embodiment, ADC1 227 is electrically configured to monitor a first voltage or drop ($V_S$) across $R_S1$ 237, ADC2 229 is electrically configured to monitor a third voltage ($V_H$) between the CAN-H 201 wire and an electrical ground, ADC3 231 is electrically configured to monitor a second voltage ($V_{CAN}$) between the CAN-H 201 wire and the CAN-L 203 wire of the communications bus, and ADC4 233 is electrically configured to monitor a fourth voltage ($V_L$) between the CAN-L 203 wire and the ground. In one embodiment the ADC3 231 arrangement may be eliminated.

Figure 3:
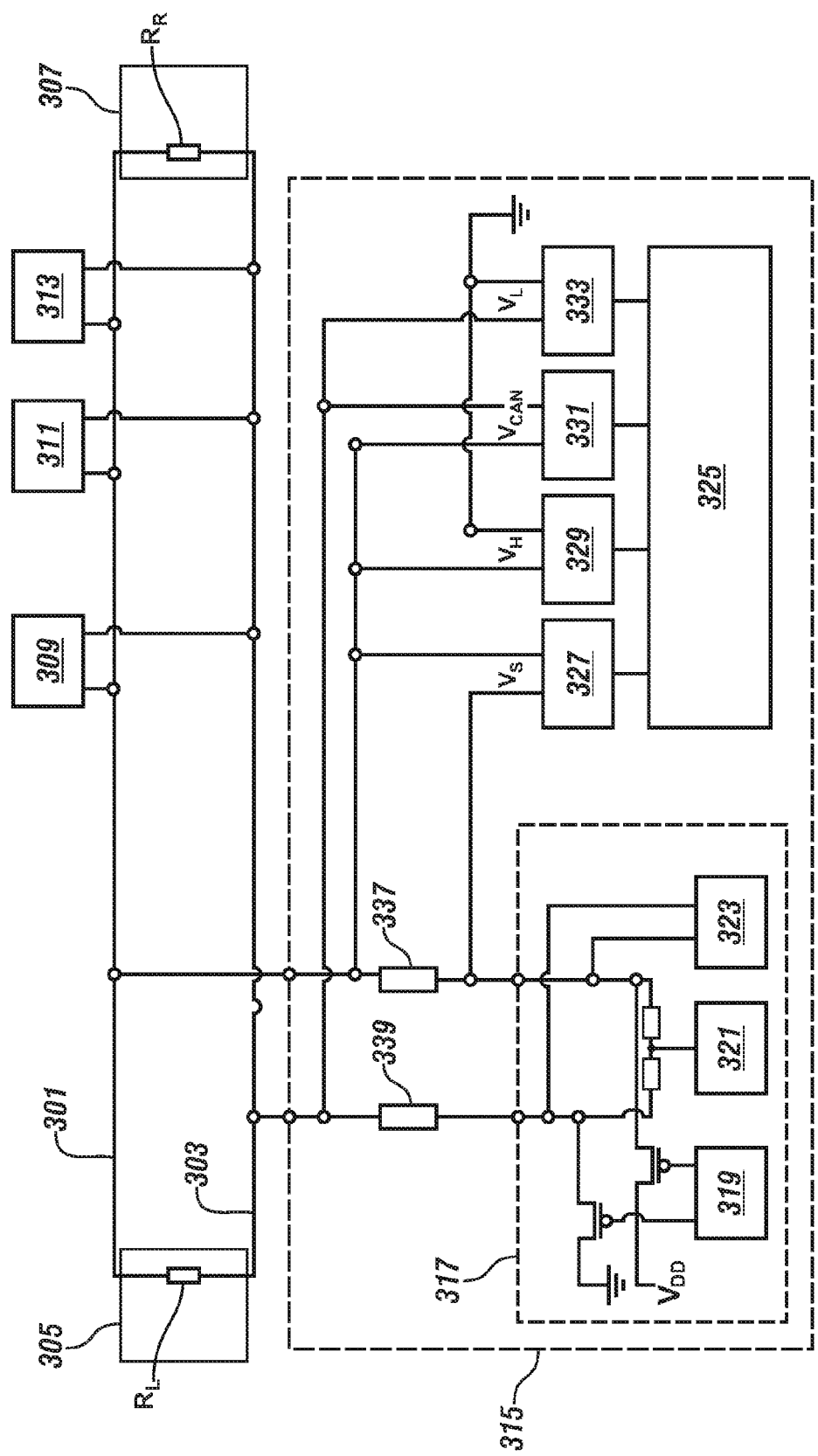
FIG. 3 illustrates an integrated controller area network similar to the CAN of FIG. 1, including a plurality of nodes, e.g., controllers, a monitoring controller, and a two-wire CAN bus including wire cables CAN-H and CAN-L electrically connected between terminators in a standard termination configuration, in accordance with the disclosure.

FIG. 3 illustrates one embodiment of an integrated controller area network similar to the CAN shown with reference to FIG. 1, including a two-wire CAN bus including wire cables CAN-H 301 and CAN-L 303 electrically connected between terminators 305, 307 in a standard termination configuration. The ends of the wire cables CAN-H 301 and CAN-L 303 are electrically connected via respective resistors $R_L$ and $R_R$. Thus in the standard configuration termination each terminator has a total resistance equal to the respective resistor. And, the total CAN bus resistance (i.e. between CAN-H wire and CAN-L wire) is substantially equal to the termination resistances of the terminators in parallel. In one embodiment each of the resistors has a magnitude of 120Ω. Thus each terminator has a total resistance equal 120Ω. And, the total CAN bus resistance (i.e. between CAN-H wire and CAN-L wire) is substantially equal to 60Ω. Alternative configurations are envisioned wherein the resistance of each terminator is not equivalent to the other. In any envisioned alternative, it may be desirable that the total CAN bus resistance (i.e. between CAN-H wire and CAN-L wire) is substantially equal to 60Ω or some other industry standard.

A plurality of nodes, e.g., controllers ECU1 309, ECU2 311, ECU3 313 and ECU-M 315 signally connect to the CAN. As shown, ECU-M 315 is a monitoring controller. As shown, ECU-M 315 is a monitoring controller. Each of the controllers may be capable of monitoring and providing the same or similar diagnostic functionality as that described with respect to ECU-M 315.

The monitoring controller ECU-M 315 includes a CAN transceiver device 317 including a signal transmitter 319, a bias control 321 and a receiver 323 that signally connect to the wire cables CAN-H 301 and CAN-L 303 of the CAN bus via first and second shunt resistors ($R_S1$ 337, $R_S2$ 339), respectively. The first and second shunt resistors are high-precision, low impedance devices each preferably having a value at or near 1.0Ω and preferably of the same magnitude. The monitoring controller ECU-M 315 also includes a microcontroller (MCU) 315 that signally connects to a plurality of analog-to-digital converters (ADC1 327, ADC2 329, ADC3 331, ADC4 333) and a plurality of executable control routines.

As shown in one embodiment, ADC1 327 is electrically configured to monitor a first voltage or drop ($V_S$) across $R_S1$ 337, ADC2 329 is electrically configured to monitor a third voltage ($V_H$) between the CAN-H 301 wire and an electrical ground, ADC3 331 is electrically configured to monitor a second voltage ($V_{CAN}$) between the CAN-H 301 wire and the CAN-L 303 wire of the communications bus, and ADC4 333 is electrically configured to monitor a fourth voltage ($V_L$) between the CAN-L 303 wire and the ground. In one embodiment the ADC4 333 arrangement may be eliminated. Each of the ADCs preferably has a sampling rate greater than 100 kHz to monitor the various voltages on the CAN bus at a rate that captures the first and second voltages during occurrence of a fault.

A communications fault is a malfunction that leads to a lost or corrupted message on the CAN bus thus interrupting communications between controllers in the CAN. A communications fault may be caused by an open link on CAN-H or CAN-L, or a short to power or to ground on CAN-H or CAN-L, or a short between CAN-H and CAN-L, and can be location-specific. A communications fault may be the result of a fault in one of the controllers, a fault in one of the communications links of the CAN bus, a fault in one of the power links of the power grid, or a fault in one of the ground links of the ground grid.

A short-lived CAN fault is defined as any malfunction of short duration that causes a temporary fault leading to a lost or corrupted message on the CAN bus. The short duration malfunction lasts for a short period of time, e.g., less than a second, and may be self-correcting. An intermittent CAN fault is defined as a short-lived CAN fault that occurs at least twice within a predefined time window, which may be ten seconds in one embodiment. A transient CAN fault is defined as a short-lived fault that occurs only once within the predefined time window.

Figure 4:
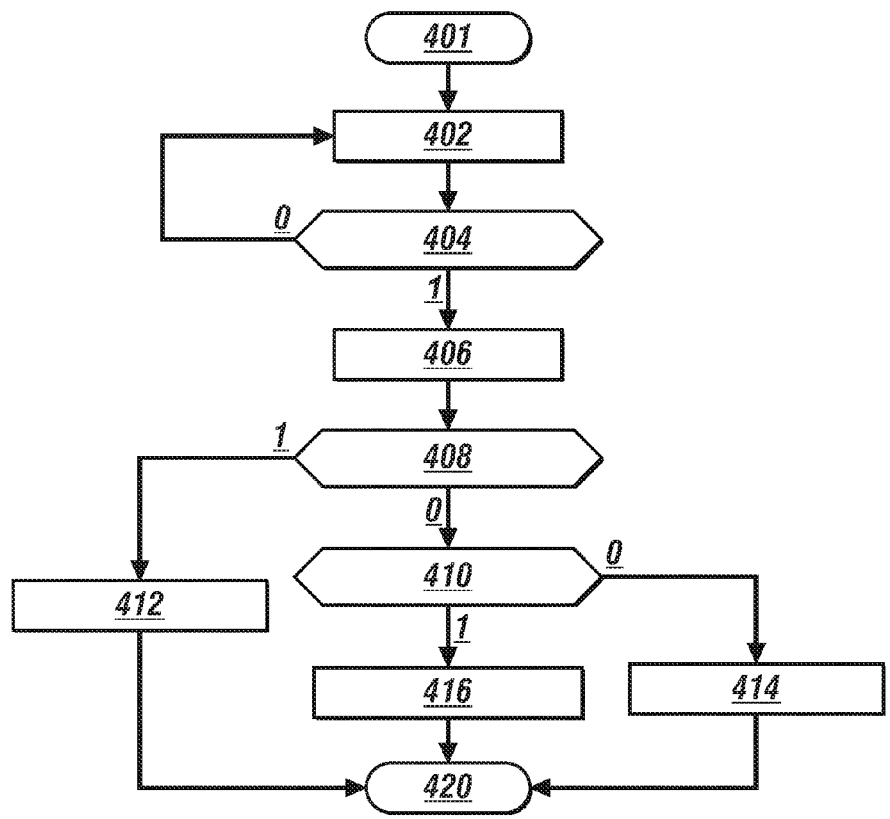
FIG. 4 illustrates an exemplary wire-open fault detection routine for monitoring a two-wire CAN, including both the two-wire CAN bus including wire cables CAN-H and CAN-L electrically connected between terminators in a split termination configuration and in a standard termination configuration, in accordance with the disclosure.

FIG. 4 illustrates an exemplary wire-open fault detection routine 400 for monitoring a two-wire CAN, including both the two-wire CAN bus including wire cables CAN-H and CAN-L electrically connected between terminators in a split termination configuration described in FIG. 2 and the two-wire CAN bus including wire cables CAN-H and CAN-L electrically connected between terminators in a standard termination configuration described in FIG. 3. The routine 400 is broken into certain logical "steps" in accordance with numerically labeled blocks. However, the particular steps may be reordered, altered, combined, separated or otherwise implemented in alternative manners apparent to one having ordinary skill in the art. Therefore, the routine of FIG. 4 is understood to be exemplary in nature and that one having ordinary skill in the art may achieve the functions embodied in the routine in alternative hardware and software implementations. Table 1 is provided as a key to wire-open fault detection routine 400 of FIG. 4, wherein the numerically labeled blocks and the corresponding functions are set forth as follows.

TABLE 1

| BLOCK | BLOCK CONTENTS |
|---|---|
| 401 | Start |
| 402 | Read $V_{CAN}$, $V_S$ |
| 404 | Is $V_S/R_S > 0.01$ A? |
| 406 | $R_{CAN} = V_{CAN}/(V_S * R_S)$ |
| 408 | Is $\text{abs}(R_{CAN} - 60) \leq R1_{err}$? |
| 410 | Is $\text{abs}(R_{CAN} - 120) \leq R2_{err}$? |
| 412 | No Wire open fault |
| 414 | Wrong Impedance fault |
| 416 | Wire open fault; Call fault-type diagnosis routine |
| 420 | End |

The shunt resistors ($R_S1$, $R_S2$) have small resistance values ($R_S \leq 1.0$ ohm) in the bus connections between the CAN and ECU-M. The two resistors act to maintain the symmetry of the circuit for the common-mode bus voltage during communication. Two voltages $V_S$ and $V_{CAN}$ are measured when ECU-M transmits messages on the CAN bus. The magnitude of $V_S$ is greater than zero when ECU-M transmits messages, permitting calculation of current on the CAN bus, with current determined as $I=V_S/R_S$. One having ordinary skill in the art will recognize that CAN bus current (I) can alternatively be determined with a current sensor imbedded as part of the monitoring controller. Thus, the resistance of the CAN bus ($R_{CAN}$) is determined in accordance with the following relationship.

$$R_{CAN} = \frac{V_{CAN}}{I} = \frac{V_{CAN}}{(V_S \times R_S)} \quad [1]$$

Thus, the wire-open fault detection routine 400 operates as follows. Upon starting execution (401), the ECU-M monitors $V_S$ and $V_{CAN}$ (402). The system verifies that some current greater than a threshold is present ($V_S/R_S>0.01$ A) (404), and if so (404)(1), calculates CAN resistance $R_{CAN}$ using EQ. 1 (406). The CAN resistance $R_{CAN}$ is compared to a predefined error resistance associated with the termination resistance by first comparing $R_{CAN}$ to the expected resistance of the CAN bus without a fault. In such a case, the expected resistance is substantially equivalent to the parallel combination of the two terminator's resistances. (Is $\text{abs}(R_{CAN}-60) \leq R1_{err}$) (408), and when the CAN resistance $R_{CAN}$ is less than the error (408)(1), the routine indicates that no wire-open fault is present (412) and this iteration ends (420).

Figure 5:
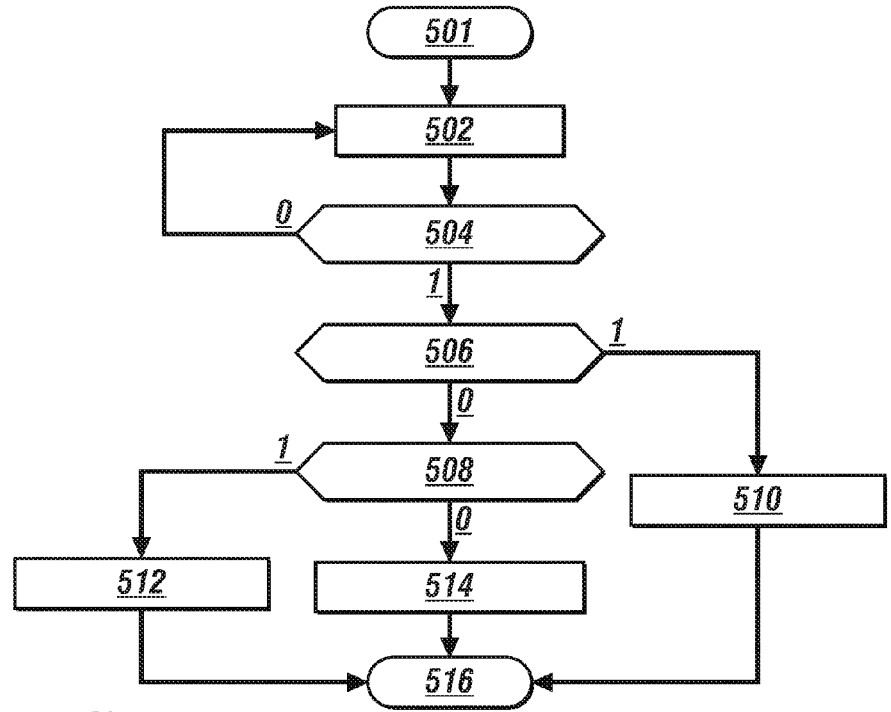
FIG. 5 illustrates a first wire-open fault type diagnosis routine for diagnosing a fault type when a wire-open fault is detected in a two-wire CAN, including both the two-wire CAN bus including wire cables CAN-H and CAN-L electrically connected between terminators in a split termination configuration wherein data for the CAN bus voltage levels $V_H$ and $V_L$ are simultaneously monitored and recorded, in accordance with the disclosure.
Figure 6:
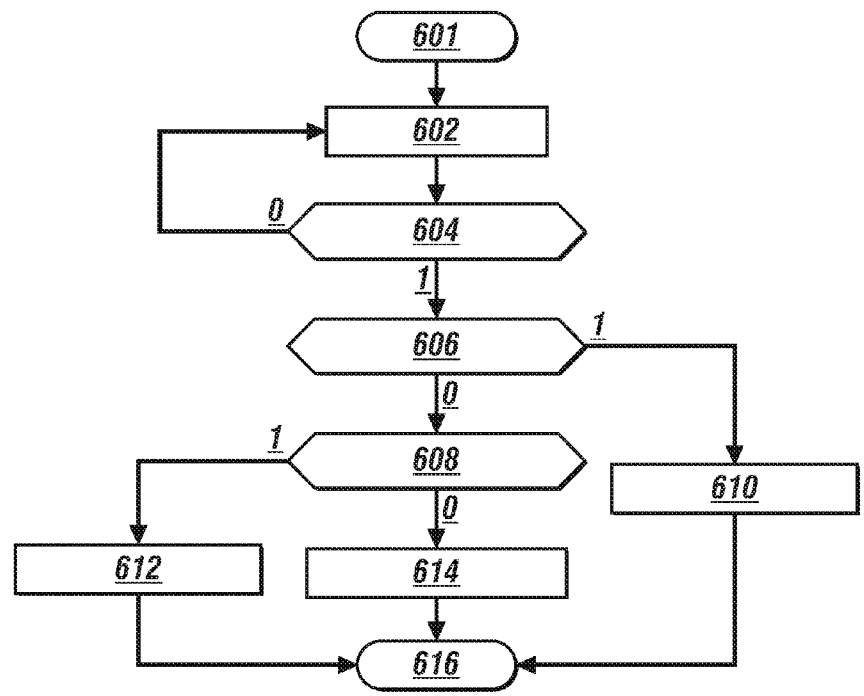
FIG. 6 illustrates a second wire-open fault type diagnosis routine for diagnosing a fault type when a wire-open fault is detected in a two-wire CAN, including both the two-wire CAN bus including wire cables CAN-H and CAN-L electrically connected between terminators in a split termination configuration wherein data for the CAN bus voltage levels $V_H$ and $V_L$ are asynchronously monitored and recorded, in accordance with the disclosure.

When the CAN resistance $R_{CAN}$ is greater than the error (408)(0), the CAN resistance $R_{CAN}$ is compared to the termination resistance (Is $\text{abs}(R_{CAN}-120) \leq R2_{err}$) (410), and when the CAN resistance $R_{CAN}$ is outside a range near the termination resistance (410)(0), the routine indicates presence of a wrong impedance fault (414) and this iteration ends (420). When the CAN resistance $R_{CAN}$ is within a range near the termination resistance (410)(1), the routine indicates presence of a wire-open fault, and wire-open fault-type diagnosis routine is called (416) and this iteration ends (420). FIGS. 5 and 6 depict embodiments of wire-open fault-type diagnosis routines.

Thus, in a configuration wherein each termination resistance is 120Ω, if $R_{CAN}$ is around 60 ohms then there is no wire open fault. However, when $R_{CAN}$ is around 120 ohms then there is a wire-open fault and it could be both CAN-H and CAN-L open, or only CAN-H open, or only CAN-L open. Thus, if $|R_{CAN}-60| \leq R1_{err}$ then there is no wire-open fault; otherwise if $|R_{CAN}-120| \leq R2_{err}$ then there is a wire-open fault, with $R1_{err}$ and $R2_{err}$ being calibratable values. In the present embodiment $R1_{err}$ and $R2_{err}$ are both substantially 5Ω. One having ordinary skill in the art is capable of selecting other values, even different values, for $R1_{err}$ and $R2_{err}$, depending upon the resistance values used in the terminators for example.

When a wire open fault is detected by either the voltage based CAN resistance calculation or some other methods like fault diagnosis based on message monitoring, there is a need to diagnosis the wire open fault type. As described herein, this is accomplished with a voltage measurement based approach. The measured voltages of interest include the voltages of CAN-H and CAN-L, i.e., $V_H$ and $V_L$ as described herein. For the wire-open fault type diagnosis, the diagnostic approach differs depending upon the termination model of the CAN, i.e., the split termination model (FIG. 2) and the standard termination model (FIG. 3).

Figure 7:
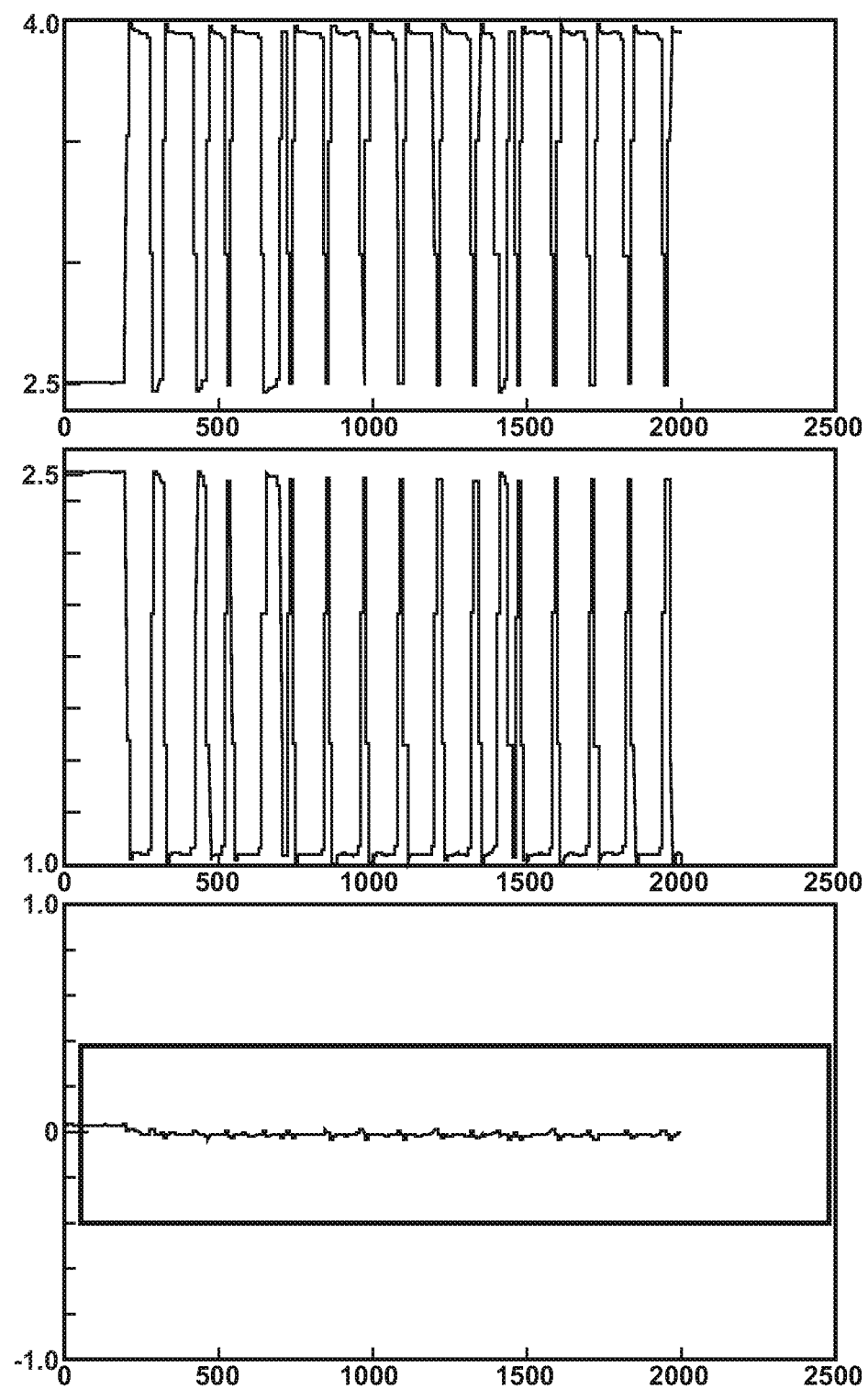
FIG. 7 illustrates data associated with operation of the CAN circuit in presence of a both-wire open fault, in accordance with the disclosure.

FIG. 7 graphically shows data associated with operation of the CAN circuit in presence of a both-wire open fault. In a CAN system employing the split termination model, the CAN circuit remains symmetric in the presence of the both-wire open fault. As such, the voltages of $V_H$ and $V_L$ remain symmetric with respect to 2.5 volts, i.e., $V_H$ ranges between around 2.5 volts to around 4 volts. Normally $V_H$ voltage shall be around 3.5 volts, but due to the wire-open fault the CAN resistance is increased from 60 ohms to 120 ohms in one embodiment, and as a result $V_H$ increases. The $V_L$ voltage ranges between 2.5 volts to around 1 volt. Normally the $V_L$ voltage shall be around 1.5 volts, but due to the wire-open fault the CAN resistance increases from 60 ohms to 120 ohms in one embodiment, and as a result the lower voltage reduces. In other words, $V_H+V_L-5.0$ has a magnitude near zero volts.

Figure 8:
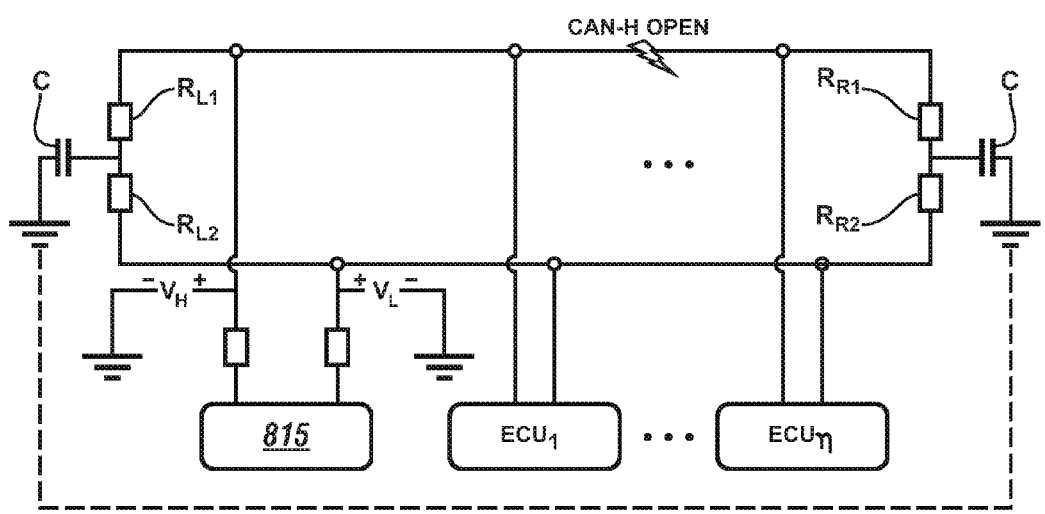
FIG. 8 illustrates a CAN circuit including a CAN-H wire open fault, in accordance with the disclosure.
Figure 9:
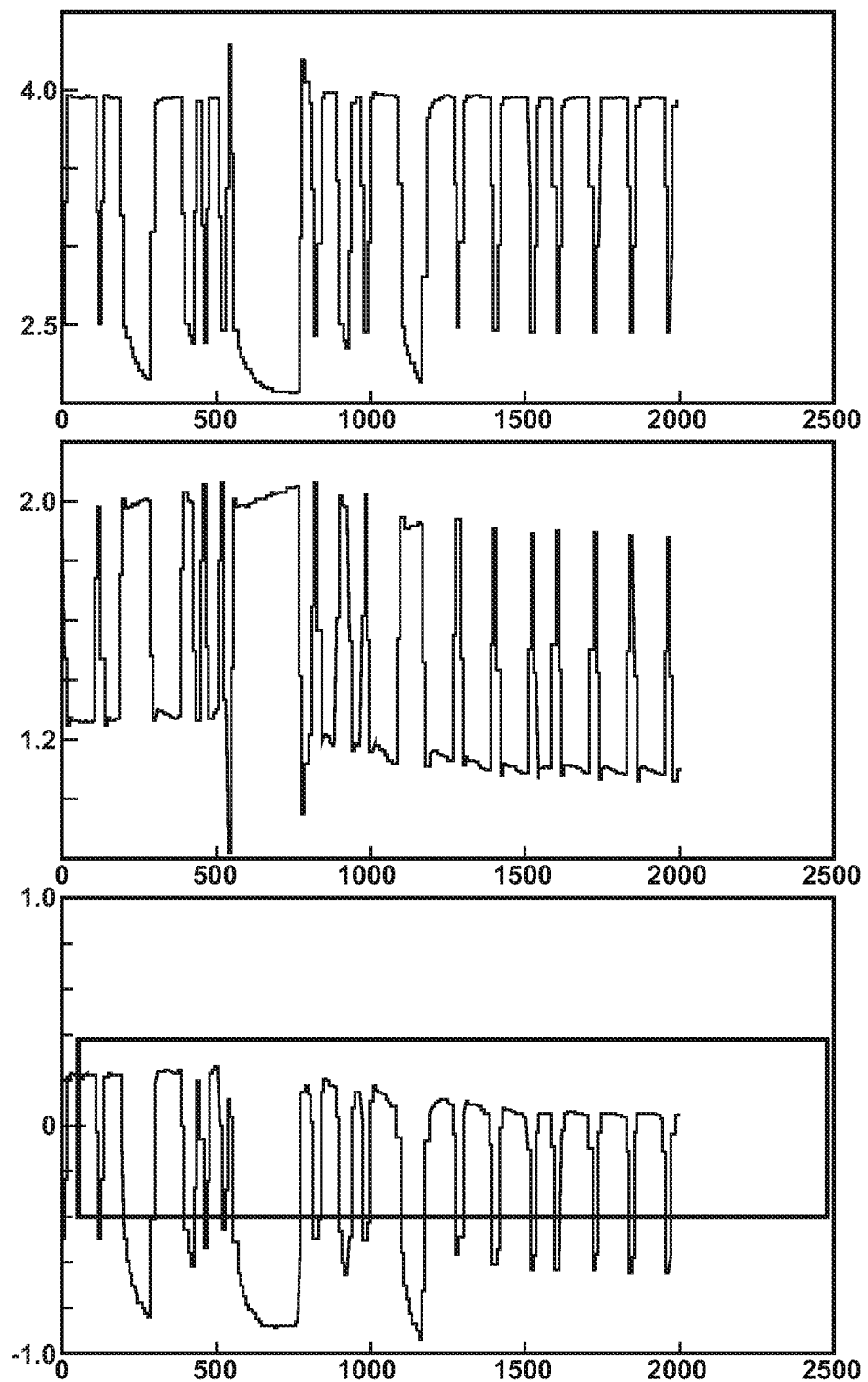
FIG. 9 illustrates data associated with operation of the CAN circuit in presence of a CAN-H wire open fault, in accordance with the disclosure.

FIG. 8 shows a CAN circuit including a CAN-H wire open fault, with corresponding data results shown graphically in FIG. 9. In a CAN system employing the split termination model, when there is a CAN-H wire open fault the CAN circuit does not remain symmetric. The $V_H$ ranges between 2.5 volts and 4 volts as in the case of both-wires open. However, $V_L$ changes and is no longer in the range between 2.5 volts to around 1 volt. As shown with reference to FIG. 8, when one of the ECUs at the left side from the location where CAN-H is open, i.e., the same side as ECU-M 815, transmits a dominant bit on the bus, $V_H$ is raised from 2.5 volts to about 3.5 volts and $V_L$ reduces from 2.5 volts to about 1.5 volts. The left side capacitor is charged to (3.5+1.5)/2=2.5 volts, but the right side capacitor is charged to 1.5 volts since there is no 3.5 volts on right side CAN-H from the left side dominant bit transmission due to the CAN-H open fault. When a recessive bit is transmitted by the same left side ECU, the $V_H$ is 2.5 volts but the $V_L$ is not 2.5 volts due to the left side capacitor (with the voltage of 2.5 volts) discharging to charge the right side capacitor (with a voltage of 1.5 volts) by the loop circuit through the CAN-L line and ground. As a result, $V_L$ is expected to be around 2.5 volts for a recessive bit transmission on the bus, but is actually around (2.5+1.5)/2=2 volts due to the discharging/charging effect of the capacitors. Thus, $(V_H+V_L-5)$ is no longer zero volts, but instead has values around (2.5+2−5)=(−0.5) volts. The value of $V_H$ during the bus idle time reduces to near 2 volts from the capacitor discharging/charging effects, and as a result the lowest value of $(V_H+V_L-5)$ can approach (2+2−5)=(−1) volt.

Figure 11:
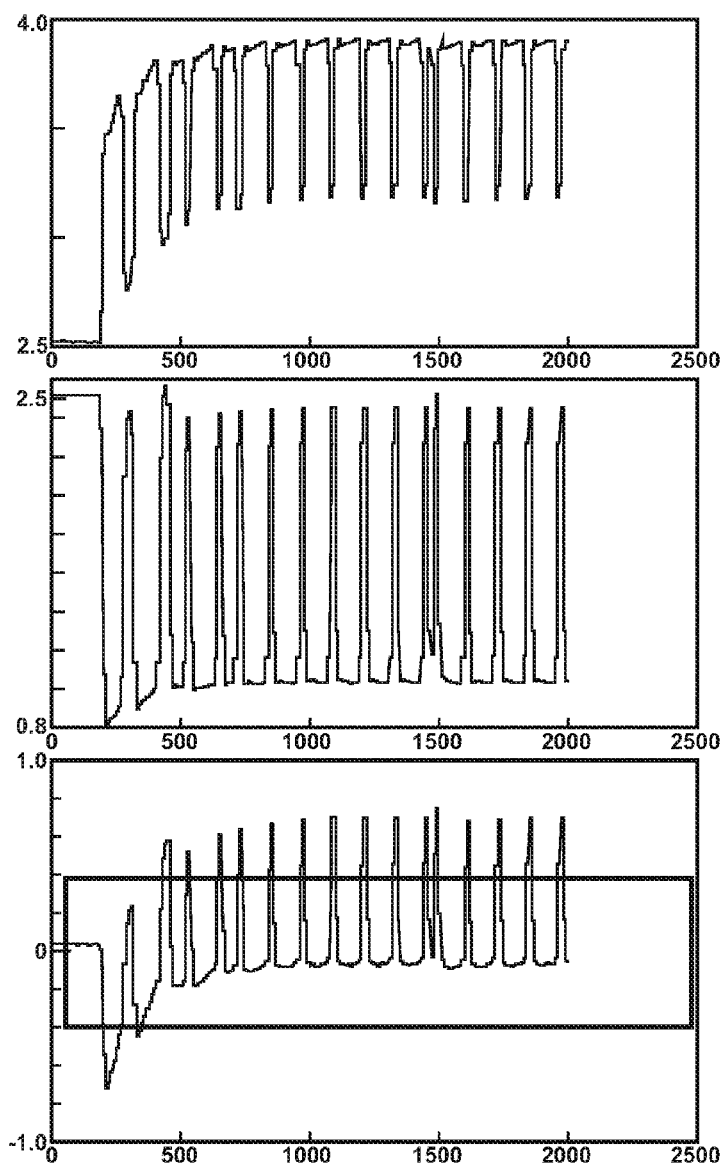
FIG. 11 illustrates data associated with operation of the CAN circuit in presence of a CAN-L wire open fault in accordance with the disclosure.
Figure 10:
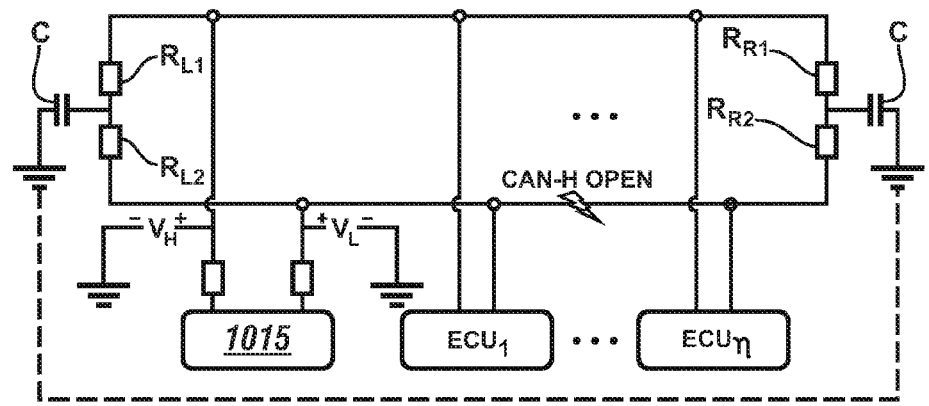
FIG. 10 illustrates a CAN circuit including a CAN-L wire open fault, in accordance with the disclosure.

FIG. 10 shows a CAN circuit including a CAN-L wire open fault, with corresponding data results shown graphically in FIG. 11. When there is a CAN-L wire open fault the CAN circuit does not remain symmetric in a CAN system employing the split termination model. The $V_L$ ranges between 2.5 volts and 1 volt, $V_H$ is no longer ranges between 2.5 volts and 4 volts. Similar to the charging/discharging effect for the case of CAN-H open fault, when a left side ECU transmits a dominant bit on the bus the left side capacitor is charged to 2.5 volts, but the right side capacitor is charged to 3.5 volts because of no 1.5 volts on the right side CAN-L from the right side dominant bit transmission due to the CAN-L open fault; and when a recessive bit is transmitted by the same left side ECU, $V_L$ has a value of 2.5 volts, but $V_H$ has a value of (2.5+3.5)/2=3 volts due to discharging of the right side capacitor (with a voltage of 3.5 volts) to charge the left side capacitor (with a voltage of 2.5 volts) by the loop circuit through the CAN-H line and the ground. Thus, $(V_H+V_L-5)$ is no longer near zero volt, but instead has peak values around (3+2.5−5)=0.5 volts.

In summary, when there is a wire open fault as detected by either the CAN resistance calculation or some other methods, the wire-open fault type diagnosis is performed by calculating $(V_H+V_L-5)$ based on the voltage measurements of $V_H$ and $V_L$ as follows, where r is a calibratable value and by default r=0.4 volts. When $(V_H+V_L-5)$ is around zero all the time, i.e., $|V_H+V_L-5|<r$, then it is a dual-wire open fault. When $(V_H+V_L-5)$ has low peak values less than or equal to (−r) during message transmitting or receiving, i.e., $(V_H+V_L-5)<=(-r)$ in at least every 6 bits (12 microseconds for 500 Kb/s bus speed) for at least 30 bits (60 microseconds for 500 Kb/s bus speed) time long, and at the same time $V_H>3$ volts and $V_L<2$ volts in at least every 6 bits, then it is a CAN-H wire open fault. When $(V_H+V_L-5)$ has high peak values bigger than or equal to r during message transmitting or receiving, i.e., $(V_H+V_L-5)>=r$ in at least every 6 bits for at least 30 bits time long, and at the same time $V_H>3$ volts and $V_L<2$ volts in at least every 6 bits, then it is a CAN-L wire open fault.

FIG. 5 illustrates a first wire-open fault type diagnosis routine 500 for diagnosing a fault type when a wire-open fault is detected in a two-wire CAN, including both the two-wire CAN bus including wire cables CAN-H and CAN-L electrically connected between terminators in a split termination configuration, e.g., as described in FIG. 2, wherein data for the CAN bus voltage levels $V_H$ and $V_L$ are simultaneously monitored and recorded. The routine 500 is broken into certain logical "steps" in accordance with numerically labeled blocks, combined, separated or otherwise implemented in alternative manners apparent to one having ordinary skill in the art. Therefore, the routine of FIG. 5 is understood to be exemplary in nature and that one having ordinary skill in the art may achieve the functions embodied in the routine in alternative hardware and software implementations. Table 2 is provided as a key to the first wire-open fault type diagnosis routine 500 of FIG. 5, wherein the numerically labeled blocks and the corresponding functions are set forth as follows.

TABLE 2

| BLOCK | BLOCK CONTENTS |
|---|---|
| 501 | Start |
| 502 | Read $V_H$, $V_L$ simultaneously |
| 504 | Is $V_H > 3.0$ V and $V_L < 2.0$ V? |
| 506 | Is $(V_H + V_L - 5) \leq r$? |
| 508 | Is $(V_H + V_L - 5) \geq r$? |
| 510 | CAN-H Wire open fault |
| 512 | CAN-L Wire open fault |
| 514 | Dual Wire Fault |
| 516 | End |

In summary, when there is a wire open fault as detected by a CAN resistance calculation, e.g., as described with reference to FIG. 4, or by some other methods, the first wire-open fault type diagnosis routine 500 can be triggered and it includes calculating and comparing $(V_H+V_L-5)$ with resistance threshold r, wherein r is a calibratable value and by default r=0.4 volts. If $(V_H+V_L-5)$ is around zero all the time, i.e., $|V_H+V_L-5|<r$, then a dual-wire open fault is indicated. However, if $(V_H+V_L-5)$ has low peak values less than or equal to (−r) during message transmitting or receiving, i.e., $(V_H+V_L-5)\leq(-r)$ in at least every 6 bits (12 microseconds for 500 Kb/s bus speed) for at least 30 bits (60 microseconds for 500 Kb/s bus speed) time long, and at the same time $V_H>3$ volts and $V_L<2$ volts in at least every 6 bits, then a CAN-H wire open fault is indicated. Likewise, when $(V_H+V_L-5)$ has high peak values greater than or equal to r during message transmitting or receiving, i.e., $(V_H+V_L-5)\geq r$ in at least every 6 bits for at least 30 bits time long, and at the same time $V_H>3$ volts and $V_L<2$ volts in at least every 6 bits, then a CAN-L wire open fault is indicated.

Thus, the first wire-open fault type diagnosis routine 500 operates as follows. Upon starting execution (501), the ECU-M monitors voltages on the CAN bus including $V_H$ and $V_L$ (502). The voltages on the CAN bus are evaluated to determine whether $V_H$ is greater than 3.0V and $V_L$ is less than 2.0V in at least every 6 bits (12 microseconds for 500 Kb/s bus speed) for at least 30 bits (60 microseconds for 500 Kb/s bus speed) time long (504), and if not (504)(0), data is again captured (502). If so (504)(1) the term $(V_H+V_L-5)$ is evaluated (506). When $(V_H+V_L-5)$ has low peak values less than or equal to (−r) during message transmitting or receiving, i.e., $(V_H+V_L-5)\leq(-r)$ in at least every 6 bits (12 microseconds for 500 Kb/s bus speed) for at least 30 bits (60 microseconds for 500 Kb/s bus speed) time long (506)(1), a CAN-H wire open fault is indicated (510) and this iteration ends (516). If not (506)(0), the $(V_H+V_L-5)$ term is evaluated to determine if it has high peak values greater than or equal to r during message transmitting or receiving (508), i.e., $(V_H+V_L-5)\geq r$ in at least every 6 bits for at least 30 bits time long, and at the same time $V_H>3$ volts and $V_L<2$ volts in at least every 6 bits. If so (508)(1), a CAN-L wire open fault is indicated (512) and this iteration ends (516). If not (508)(0), the data indicates that $(V_H+V_L-5)$ is around zero all the time, i.e., $|V_H+V_L-5|<r$, and a dual-wire open fault is indicated (514) and this iteration ends (516).

FIG. 6 illustrates a second wire-open fault type diagnosis routine 600 for diagnosing a fault type when a wire-open fault is detected in a two-wire CAN, including both the two-wire CAN bus including wire cables CAN-H and CAN-L electrically connected between terminators in a split termination configuration, e.g., as described in FIG. 2, wherein data for the CAN bus voltage levels $V_H$ and $V_L$ are asynchronously monitored and recorded. The routine 600 is broken into certain logical "steps" in accordance with numerically labeled blocks. However, the particular order of such steps may be altered, combined, separated or otherwise implemented in alternative manners apparent to one having ordinary skill in the art. Therefore, the routine of FIG. 6 is understood to be exemplary in nature and that one having ordinary skill in the art may achieve the functions embodied in the routine in alternative hardware and software implementations. Table 3 is provided as a key to the second wire-open fault type diagnosis routine 600 of FIG. 6, wherein the numerically labeled blocks and the corresponding functions are set forth as follows.

TABLE 3

| BLOCK | BLOCK CONTENTS |
|---|---|
| 601 | Start |
| 602 | Read $V_H$, $V_L$ |
| 604 | Is $V_H > 3.0$ V and $V_L < 2.0$ V |
| 606 | Is $V_L \leq 2.5 - r$ |
| 608 | Is $V_H \geq 2.5 + r$ |
| 610 | CAN-H Wire open fault |
| 612 | CAN-L Wire open fault |
| 614 | Dual Wire Fault |
| 616 | End |

To calculate $(V_H \pm V_L - 5)$ $V_H$ and $V_L$ are preferably simultaneously measured. However, if the requirement of simultaneous measurement is not reliably attainable, the wire-open fault type can be determined using the values of $V_H$ and $V_L$ captured individually. This includes, for r=0.4 volts, when $V_L$ is always less than or equal to $(2.5-r)$ during message transmitting or receiving, i.e., $V_L \leq (2.5-r)$ while $V_H > 3$ volts and $V_L < 2$ volts in at least every 6 bits for at least 30 bits long time, then a CAN-H wire open fault is indicated. When $V_H$ is always greater than or equal to $(2.5+r)$ during message transmitting or receiving, i.e., $V_H >= (2.5+r)$ while $V_H > 3$ volts and $V_L < 2$ volts in at least every 6 bits for at least 30 bits long time, then a CAN-L wire open fault is indicated. When both $V_H$ and $V_L$ do not behave like the above while $V_H > 3$ volts and $V_L < 2$ volts in at least every 6 bits for at least 30 bits long time, then a dual-wire open fault is indicated.

Thus, the second wire-open fault type diagnosis routine 600 operates as follows. Upon starting execution (601), the ECU-M monitors voltages on the CAN bus including $V_H$ and $V_L$ (602). The voltages on the CAN bus are evaluated to determine whether $V_H$ is greater than 3.0V and $V_L$ is less than 2.0V in at least every 6 bit-time in at least every 6 bits (12 microseconds for 500 Kb/s bus speed) for at least 30 bits (60 microseconds for 500 Kb/s bus speed) time long (604), and if not (604)(0), data is again captured (602). If so (604)(1) $V_L$ is evaluated (506). When $V_L$ is always less than or equal to (2.5−r) during message transmitting or receiving, i.e., $V_L \leq (2.5-r)$ while $V_H > 3$ volts and $V_L < 2$ volts in at least every 5 bits for at least 30 bits long time (606)(1), then a CAN-H wire open fault is indicated (610). Otherwise (606)(0), $V_H$ is evaluated (608), and when $V_H$ is always greater than or equal to $(2.5+r)$ during message transmitting or receiving, i.e., $V_H \geq (2.5+r)$ while $V_H > 3$ volts and $V_L < 2$ volts in at least every 6 bits for at least 30 bits long time (608)(1), a CAN-L wire open fault is indicated (612). When both $V_H$ and $V_L$ fail to behave like the above while $V_H > 3$ volts and $V_L < 2$ volts in at least every 6 bits for at least 30 bits long time, then a dual-wire open fault is indicated (614), and this iteration ends (616).

A wire-open fault type diagnosis routine for diagnosing a fault type when a wire-open fault is detected in a two-wire CAN, including both the two-wire CAN bus including wire cables CAN-H and CAN-L electrically connected between terminators in a standard termination configuration, e.g., as described in FIG. 3 is now described. For a dual-wire open fault, the CAN circuit remains symmetric as for the case of split termination model. The voltages of $V_H$ and $V_L$ remain symmetric with respect to 2.5 volts, i.e., $V_H$ ranges between 2.5 volts and 4 volts and $V_L$ ranges between 2.5 volts and 1 volt. Thus, the value of $(V_H+V_L-5)$ is around zero volts when a fault occurs.

A wire-open fault type diagnosis routine when a CAN-H open fault occurs operates as follows. Since there is no capacitor on the CAN bus, charging and discharging effects from the capacitors do not exist. But the values of $V_H$ and $V_L$ can still be used to detect the wire-open fault type. Due to the dominant bit transmission from the ECUs on the other wire-open side of the CAN bus (i.e., the side away from ECU-M relative to the CAN-H open fault), the value of $V_H$ is the same as the value of $V_L$ measured by ECU-M and both values are around 1.5 volts to 1 volt. As a result, there are low peak values of (−2) volts for $(V_H+V_L-5)$ in the case of CAN-H open. Note that if there is no ECU on the other side of the bus the CAN-H open is next to the termination resistor with the same behavior as for the dual-wire open case.

A wire-open fault type diagnosis routine when a CAN-L open fault occurs operates as follows. Due to the dominant bit transmission from the ECUs on the other wire-open side of the CAN bus (i.e., the side away from ECU-M relative to the CAN-L open fault, the value of $V_L$ is the same as the value of $V_H$ measured by ECU-M and both values are around 3.5 volts to 4 volt. As a result, there are low peak values of 2 volts for $(V_H+V_L-5)$ in the case of CAN-L open. Note that if there is no ECU on the other side of the bus the CAN-L open is next to the termination resistor with the same behavior as for the dual-wire open case.

In summary the wire-open fault type diagnosis with the standard termination includes evaluating to determine whether $(V_H+V_L-5)$ is near zero all the time, i.e., $|V_H+V_L-5|<r$, indicating either a dual-wire open fault, a CAN-H open fault next to one of the termination resistors, or a CAN-L open fault next to one of the termination resistors. In the above, r is a calibratable value and by default r=0.4 volts. When $(V_H+V_L-5)$ has low peak values less than or equal to (−2) volts, i.e., $(V_H+V_L-5) \leq (-2)$ volts from time to time, then it is a CAN-H wire open fault. When $(V_H+V_L-5)$ has high peak values bigger than or equal to 2 volts, i.e., $(V_H+V_L-5) \geq 2$ volts from time to time, then it is a CAN-L wire open fault.

The disclosure has described certain preferred embodiments and modifications thereto. Further modifications and alterations may occur to others upon reading and understanding the specification. Therefore, it is intended that the disclosure not be limited to the particular embodiment(s) disclosed as the best mode contemplated for carrying out this disclosure, but that the disclosure will include all embodiments falling within the scope of the appended claims.

The invention claimed is:

1. A controller area network (CAN) comprising:
a CAN bus including a CAN-H wire and a CAN-L wire;
a pair of CAN bus terminators located at opposite ends of the CAN bus, each terminator having a corresponding known terminator resistance value;
a plurality of nodes including controllers wherein at least one of said controllers comprises a monitoring controller; and
said monitoring controller comprising a detection control routine for detecting the presence of a wire-open fault on the CAN bus, comprising the following steps:
determining a CAN bus resistance; and
determining a wire-open fault on the CAN bus based upon the determined CAN bus resistance and the terminator resistance values.

2. The controller area network (CAN) of claim 1, wherein the step of determining a CAN bus resistance comprises the following steps:
measuring a CAN bus voltage differential between the CAN-H wire and the CAN-L wire;
determining a CAN bus current; and
determining the CAN bus resistance based upon the CAN bus voltage differential and the CAN bus current.

3. The controller area network (CAN) of claim 2, wherein the step of determining a CAN bus current comprises the following steps:
measuring a voltage drop across a known resistance through which the CAN bus current passes; and
determining the CAN bus current based upon the voltage drop and the known resistance.

4. The controller area network (CAN) of claim 1, wherein the step of determining a wire-open fault on the CAN bus based upon the determined CAN bus resistance and the terminator resistance values comprises the following steps:
comparing the determined CAN bus resistance to a first resistance value equivalent to a parallel combination of the terminator resistance values;
comparing the determined CAN bus resistance to a second resistance value equivalent to one of the terminator resistance values; and
determining a wire-open fault on the CAN bus when the determined CAN bus resistance varies from the first resistance value by a first predetermined amount and the determined CAN bus resistance varies from the second resistance value by a second predetermined amount.

5. The controller area network (CAN) of claim 2, wherein the step of determining a wire-open fault on the CAN bus based upon the determined CAN bus resistance and the terminator resistance values comprises the following steps:
comparing the determined CAN bus resistance to a first resistance value equivalent to a parallel combination of the terminator resistance values;
comparing the determined CAN bus resistance to a second resistance value equivalent to one of the terminator resistance values; and
determining a wire-open fault on the CAN bus when the determined CAN bus resistance varies from the first resistance value by a first predetermined amount and the determined CAN bus resistance varies from the second resistance value by a second predetermined amount.

6. The controller area network (CAN) of claim 1:
wherein each CAN bus terminator comprises a split terminator including a pair of series coupled resistors coupled between the CAN-H and CAN-L wires and a capacitor coupled between a node between the resistors and a ground;
wherein said monitoring controller further comprises a diagnostic control routine for diagnosing a fault type of the wire-open fault on the CAN bus, comprising the following steps:
simultaneously measuring a CAN-H voltage and a CAN-L voltage; and
determining the fault type as one of a CAN-H wire open, CAN-L wire open and dual wire open based upon comparisons of summations of the CAN-H voltage and a CAN-L voltage.

7. The controller area network (CAN) of claim 1:
wherein each CAN bus terminator comprises a split terminator including a pair of series coupled resistors coupled between the CAN-H and CAN-L wires and a capacitor coupled between a node between the resistors and a ground; and
wherein said monitoring controller further comprises a diagnostic control routine for diagnosing a fault type of the wire-open fault on the CAN bus, comprising the following steps:
asynchronously measuring a CAN-H voltage and a CAN-L voltage; and
determining the fault type as one of a CAN-H wire open, CAN-L wire open and dual wire open based upon individual comparisons of the CAN-H voltage and a CAN-L voltage.

8. The controller area network (CAN) of claim 1:
wherein each CAN bus terminator comprises a standard terminator including a resistor coupled between the CAN-H and CAN-L wires; and
wherein said monitoring controller further comprises a diagnostic control routine for diagnosing a fault type of the wire-open fault on the CAN bus, comprising the following steps:
measuring a CAN-H voltage and a CAN-L voltage; and
determining the fault type as one of a CAN-H wire open, CAN-L wire open and dual wire open based upon comparisons of summations of the CAN-H voltage and a CAN-L voltage.

9. A controller area network (CAN) including a plurality of CAN elements comprising a communication bus and a plurality of controllers, comprising:
a two-wire communications bus including first and second terminators, each terminator comprising a known termination resistance electrically connected between first and second wires of the communications bus;
a plurality of controllers signally connected to the communications bus;
a monitoring controller signally connected to a first of the wires of the communications bus via a first shunt resistor and signally connected to a second of the wires of the communications bus via a second shunt resistor, the first and second shunt resistors being equal in resistance;
said monitoring controller monitoring a first voltage ($V_S$) across the second shunt resistor, monitoring a second voltage ($V_{CAN}$) between the first and second wires of the communications bus, monitoring a third voltage ($V_H$) between the second wire of the communications bus and an electrical ground, and monitoring a fourth voltage ($V_L$) between the first wire of the communications bus and the ground, said monitoring controller calculating a resistance of the communications bus based upon the first and second voltages and the resistance of the second shunt resistor;

said monitoring controller detecting presence of a wire-open fault in the two-wire communications bus when the calculated resistance of the communications bus equals the known termination resistance of the terminators; and said monitoring controller diagnosing one of a wire-open fault in the first wire, a wire-open fault in the second wire, and a wire-open fault in both the first and second wires based upon $V_H$ and $V_L$.

10. The controller area network (CAN) of claim 9 wherein each terminator comprises a split terminator including a pair of series coupled resistors coupled between the first wire of the communications bus and the second wire of the communications bus, and a capacitor coupled between a node between the series coupled resistors and the ground.

11. The controller area network (CAN) of claim 9 wherein each terminator comprises a standard terminator including a resistor coupled between the first wire of the communications bus and the second wire of the communications bus.

12. A controller area network (CAN) comprising:
a CAN bus including a CAN-H wire and a CAN-L wire;
a pair of CAN bus terminators located at opposite ends of the CAN bus, each terminator having a corresponding known terminator resistance value;
a plurality of nodes including controllers wherein at least one of said controllers comprises a monitoring controller; and
said monitoring controller comprising a detection control routine for detecting the presence of a wire-open fault on the CAN bus, comprising the following steps:
determining a CAN bus resistance;
comparing the determined CAN bus resistance to a first resistance value equivalent to a parallel combination of the terminator resistance values;
comparing the determined CAN bus resistance to a second resistance value equivalent to one of the terminator resistance values; and
determining a wire-open fault on the CAN bus when the determined CAN bus resistance varies from the first resistance value by a first predetermined amount and the determined CAN bus resistance varies from the second resistance value by a second predetermined amount.

13. The controller area network (CAN) of claim 12:
wherein each CAN bus terminator comprises a split terminator including a pair of series coupled resistors coupled between the CAN-H and CAN-L wires and a capacitor coupled between a node between the resistors and a ground; and
wherein said monitoring controller further comprises a diagnostic control routine for diagnosing a fault type of the wire-open fault on the CAN bus, comprising the following steps:
simultaneously measuring a CAN-H voltage and a CAN-L voltage; and
determining the fault type as one of a CAN-H wire open, CAN-L wire open and dual wire open based upon comparisons of summations of the CAN-H voltage and a CAN-L voltage.

14. The controller area network (CAN) of claim 12:
wherein each CAN bus terminator comprises a split terminator including a pair of series coupled resistors coupled between the CAN-H and CAN-L wires and a capacitor coupled between a node between the resistors and a ground;
wherein said monitoring controller further comprises a diagnostic control routine for diagnosing a fault type of the wire-open fault on the CAN bus, comprising the following steps:
asynchronously measuring a CAN-H voltage and a CAN-L voltage; and
determining the fault type as one of a CAN-H wire open, CAN-L wire open and dual wire open based upon individual comparisons of the CAN-H voltage and a CAN-L voltage.

15. The controller area network (CAN) of claim 12:
wherein each CAN bus terminator comprises a standard terminator including a resistor coupled between the CAN-H and CAN-L wires; and
wherein said monitoring controller further comprises a diagnostic control routine for diagnosing a fault type of the wire-open fault on the CAN bus, comprising the following steps:
measuring a CAN-H voltage and a CAN-L voltage; and
determining the fault type as one of a CAN-H wire open, CAN-L wire open and dual wire open based upon comparisons of summations of the CAN-H voltage and a CAN-L voltage.

* * * * *

UNITED STATES PATENT AND TRADEMARK OFFICE
CERTIFICATE OF CORRECTION

PATENT NO. : 9,568,533 B2
APPLICATION NO. : 14/720382
DATED : February 14, 2017
INVENTOR(S) : Shengbing Jiangj, Xinyu Du and Natalie Ann Wienckowski Page 1 of 1

It is certified that error appears in the above-identified patent and that said Letters Patent is hereby corrected as shown below:

In the Specification

Column 7, Lines 26 to 38:

|  | TABLE 1 | |
| --- | --- | --- |
|  | BLOCK | BLOCK CONTENTS |
| That portion of the formula reading: | "406 | $R_{CAN} = V_{CAN}/(V_S * R_S)$" |
| Should be corrected to read as: | 406 | $R_{CAN} = V_{CAN}/(V_S / R_S)$ |

Column 7, the Equation 1 between Lines 55 to 57 reading:

$$\text{``} R_{CAN} = \frac{V_{CAN}}{I} = \frac{V_{CAN}}{(V_S \times R_S)} \qquad [1] \text{''}$$

Should be corrected to read as:

$$R_{CAN} = \frac{V_{CAN}}{I} = \frac{V_{CAN}}{(V_S / R_S)} \qquad [1]$$

Signed and Sealed this
Thirteenth Day of June, 2017

Joseph Matal
*Performing the Functions and Duties of the*
*Under Secretary of Commerce for Intellectual Property and*
*Director of the United States Patent and Trademark Office*